US007486146B2

(12) United States Patent
Lin

(10) Patent No.: US 7,486,146 B2
(45) Date of Patent: Feb. 3, 2009

(54) LOOP SYSTEM CAPABLE OF AUTO-CALIBRATING OSCILLATING FREQUENCY RANGE AND RELATED METHOD

(75) Inventor: Eric-Wei Lin, Torrance, CA (US)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 72 days.

(21) Appl. No.: 11/829,102

(22) Filed: Jul. 27, 2007

(65) Prior Publication Data
US 2008/0100385 A1 May 1, 2008

(30) Foreign Application Priority Data
Nov. 1, 2006 (TW) .............................. 95140378 A

(51) Int. Cl.
*H03L 7/087* (2006.01)
*H03L 7/095* (2006.01)
*H03L 7/113* (2006.01)
*H03L 7/18* (2006.01)

(52) U.S. Cl. .................... 331/14; 331/1 A; 331/11; 331/16; 331/17; 331/18; 331/DIG. 2

(58) Field of Classification Search ................. 331/1 A, 331/8, 10, 11, 14, 16–18, 25, DIG. 2; 327/156–159; 332/127; 360/51; 375/376; 455/260
See application file for complete search history.

(56) References Cited

U.S. PATENT DOCUMENTS 7,349,514 B2 * 3/2008 Meltzer et al. .............. 375/376

* cited by examiner

*Primary Examiner*—David Mis
(74) *Attorney, Agent, or Firm*—Winston Hsu

(57) ABSTRACT

A loop system capable of auto-calibrating an oscillating frequency range includes a frequency error detector, a voltage controlled oscillator (VCO), a voltage input unit, and a switch. The frequency error detector includes a rotational frequency detector, a state machine, and an up-down counter. The rotational frequency detector is used for comparing the reference frequency and the feedback frequency. The state machine is used for determining an auto-calibration state. The up-down counter is used for generating the second control signal or the coarse-lock-state signal. The VCO is used for selecting to operate at one of a plurality of frequency operating curves so as to generate an oscillating signal. The voltage input unit is used for providing a fixed voltage to the VCO. The switch is used for switching the VCO to couple to the voltage input unit or to couple to a fine frequency tuner.

18 Claims, 5 Drawing Sheets

LOOP SYSTEM CAPABLE OF AUTO-CALIBRATING OSCILLATING FREQUENCY RANGE AND RELATED METHOD

BACKGROUND OF THE INVENTION

1. Field of the Invention

The present invention relates to a loop system for a voltage-controlled oscillator and related method, and more particularly, to a loop system having a plurality of frequency operating curves capable of auto-calibrating an oscillating frequency range and related method.

2. Description of the Prior Art

In an electronic device, clock signal synthesis and system synchronization are critical issues influencing accuracy of signal processing. For example, in a mixed signal system, an analog-to-digital (A/D) converter demands a low-jitter clock signal for sampling signals. In a wireless communications system, such as a Bluetooth or Global system for mobile communications (GSM) system, a radio frequency (RF) circuit requires a frequency synthesizer to generate carrier signals so as to transmit a baseband signal in a higher frequency band. In general, the foregoing applications adopt a phase-locked loop circuit for a stable and precise clock signal.

A phase-locked loop locks a phase difference between a periodic output signal and a periodic input signal through a feedback mechanism so as to stabilize a clock signal. Please refer to FIG. 1, which depicts a schematic diagram of a phase-locked loop (PLL) circuit 100 according to the prior art. The PLL circuit 100 includes a reference divider 102, a phase/frequency detector (PFD) 104, a charge pump 106, a loop filter 108, a voltage-controlled oscillator (VCO) 110 and a feedback divider 112. As can be seen from FIG. 1, the reference divider 102 divides a frequency of an input signal FIN to obtain a reference signal FREF. The PFD 104 is responsible for comparing a phase of the reference signal FREF with that of a feedback signal FFB to generate an error signal. When the reference signal FREF leads the feedback signal FFB in phase, the error signal is an up signal; when the reference signal FREF lags the feedback signal FFB in phase, the error signal is a down signal. A pulse width of the error signal indicates a phase difference between the reference signal FREF and the feedback signal FFB. According to the error signal, the charge pump 106 generates a specific electric charge for adjustment of the loop filter 108. When the error signal is outputted as the up signal, the charge pump 106 adds the electric charge to the loop filter 108. On the contrary, when the error signal is outputted as the down signal, the charge pump 106 withdraws the electric charge from the loop filter 108. The loop filter 108 is commonly a simple RC circuit functioning as an integrator, and is used for storing electric charge from the charge pump 106. The VCO 110 generates a periodic output signal FOSC when an output voltage VC of the loop filter 108 is inputted to the VCO 110. The feedback divider 112 performs division on frequency of the output signal FOSC to generate the feedback signal FFB. Thus, a phase-locked loop L1 is established. In general, the VCO 110 outputs a higher frequency range than the input signal FIN does, so that frequency of the output signal FOSC is a mixed fraction or a multiple of frequency of the input signal FIN. Thus, by adjusting a dividing factor of the reference divider 102 and the feedback divider 112, the PFD 104 can operate in a lower frequency range, so that likelihood of phase-comparison errors in the PFD 104, such as dead zone, can be decreased.

As mentioned above, the PLL circuit 100 can adjust an operating frequency of the VCO 110 by comparing the phase of the reference signal FREF with that of the feedback signal FFB continuously. The VCO eventually locks at a resulting frequency, which is extremely close to or right on the target frequency, and the output signal FOSC is regarded as a clock signal. For example, in a GSM 900 system, the physical layer of the network system uses a frequency band centralized at 900 MHz, and bandwidth of every carrier is defined to be as wide as 200 KHz. When a transmitter needs to transmit signals in a higher frequency band, the PLL circuit 100 converts the reference signal FREF to a 200 KHz periodic signal by setting the dividing number of the reference divider 102. And, since 900M is 4500 times 200K, the dividing factor of the feedback divider 112 should be set to 4500. The PLL circuit 100 continuously compares the phase of the reference signal FREF with the phase of the feedback signal FFB. The feedback signal FFB is persistently adjusted by the VCO 110 to increase its frequency to 900 MHz so that the baseband signal is up-converted to the high frequency band.

Generally, the VCO 110 shown in FIG. 1 is designed for applications operating in a large operating frequency range such as a commonly used range from 40 kHz to 400 MHz. However, the larger operating frequency range a frequency operating curve of the VCO 110 covers, the more noise will be generated in the PLL circuit 100. In order to reduce noise in the PLL circuit 100, a gain of the VCO 110 is required to be sufficiently small. That is to say, a slope of the frequency operating curve of the VCO 110 should be gentle. Thus, to achieve both a large operating frequency range and low-noise operation, the VCO 110 is usually designed to have a plurality of operating curves having gentle slopes. Each of the operating curves is a function of input voltages, as shown in FIG. 2. Based on a variety of applications, the PLL circuit 100 has to use different operating frequency ranges, so a specific frequency operating curve is selected for the VCO 110 to operate. Ideally, the VCO 110 designed in the same architecture should have the same central frequency and the same curve slopes in their frequency operating curves. As a result, each PLL 100 just chooses the same, fixed frequency range for the VCO 110 for a specific application. However, in practice, the characteristics (range coverage) of frequency operating curves may vary from VCO 110 to VCO 110 due to potential variations in fabrication of the VCO. For example, the frequency operating curves shown in the FIG. 2 may jointly be shifted up, down, left or right from VCO 110 to VCO 110. Moreover, the frequency operating curves may even have different slopes. As a result, for some applications, the VCO 110 of the PLL 100 needs a control signal to select a frequency range appropriate for the desired output frequency.

Conventionally, every VCO 110 is tested in the factory to characterize the frequency ranges and to predetermine which control signal matches the desired output frequency. As for a specific application for use with the VCO 110, appropriate control settings are permanently burned into the VCO device by blowing fuse links or hard-wiring. Therefore, in the prior art, the factory testing process and hard-wiring of the VCO 110 increase the cost of manufacturing the PLL. The frequency range of the prior art PLL is also limited to a permanently predetermined frequency range.

SUMMARY OF THE INVENTION

Therefore, it is an object of the present invention to provide a loop system capable of auto-calibrating an oscillating frequency range and related method.

The present invention discloses a loop system capable of auto-calibrating an oscillating frequency range. The loop system comprises a frequency error detector, a voltage controlled oscillator (VCO), a voltage input unit, and a switch. The frequency error detector is used for generating a second control signal or a coarse-lock-state signal and performing coarse tuning in accordance with a reference frequency and a feedback frequency. The frequency error detector comprises a rotational frequency detector, a state machine and an up-down counter. The rotational frequency detector is used for comparing the reference frequency and the feedback frequency so as to generate a first control signal. The state machine is coupled to the rotational frequency detector, for determining an auto-calibration state in accordance with a polarity of the first control signal and a time-counting signal. The up-down counter is coupled to the state machine, for generating the second control signal or the coarse-lock-state signal in accordance with the auto-calibration state. The VCO is coupled to the frequency error detector, for selecting to operate at one of a plurality of frequency operating curves in accordance with the second control signal so as to generate an oscillating signal. The voltage input unit is used for providing a fixed voltage to the VCO. The switch is used for switching the VCO to couple to the voltage input unit or to couple to a fine frequency tuner in accordance with the coarse-lock-state signal.

The present invention further discloses a method of auto-calibrating an oscillating frequency range. A reference frequency and a feedback frequency are compared so as to generate a first control signal. An auto-calibration state is determined in accordance with a polarity of the first control signal and a time-counting signal. A second control signal or a coarse-lock-state signal is generated in accordance with the auto-calibration state, and a voltage controlled oscillator (VCO) is controlled to operate at one of a plurality of frequency operating curves in accordance with the second control signal so as to generate an oscillating signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
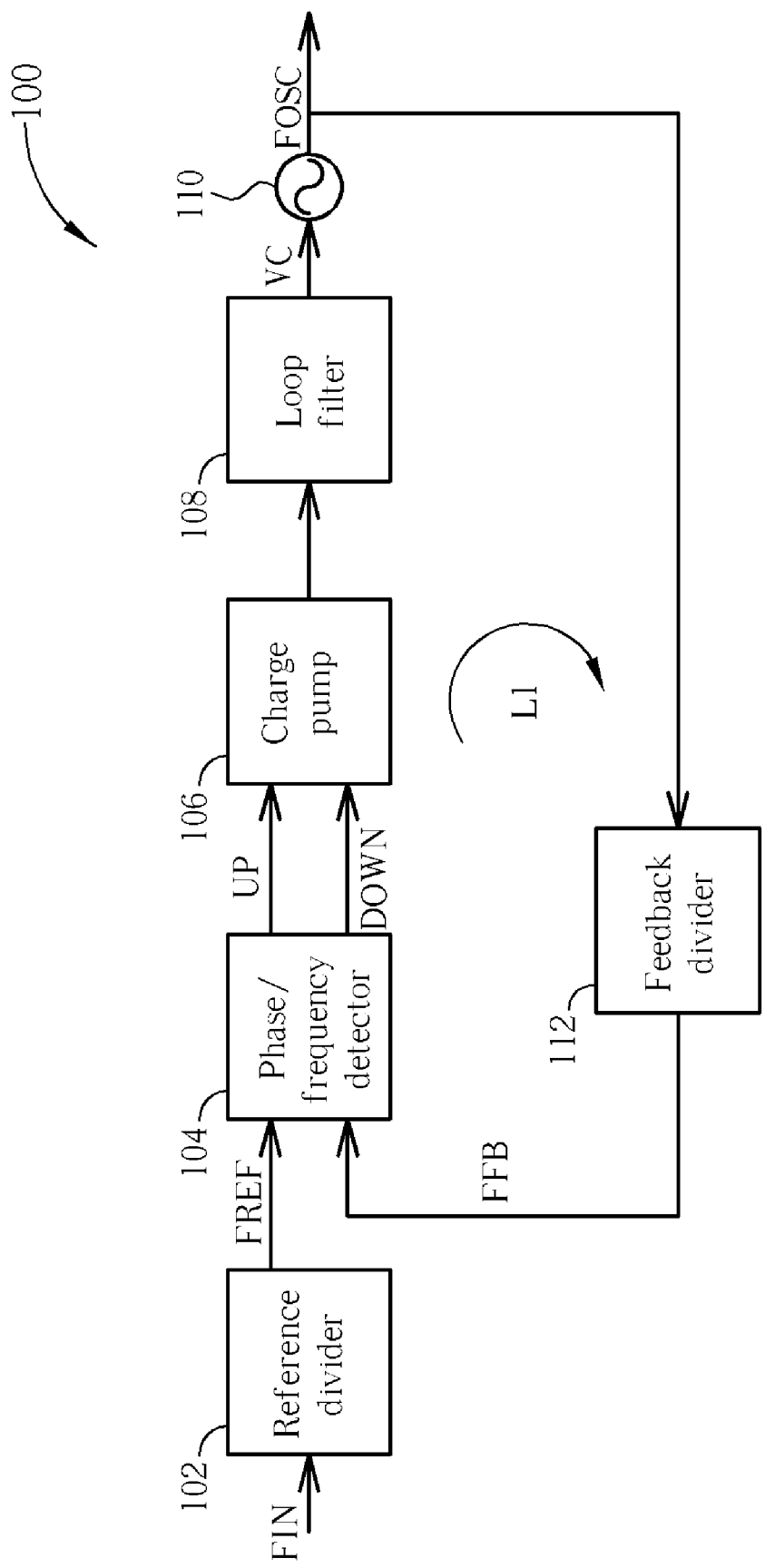
FIG. 1 is a schematic diagram of a phase-locked loop (PLL) circuit according to the prior art.
Figure 2:
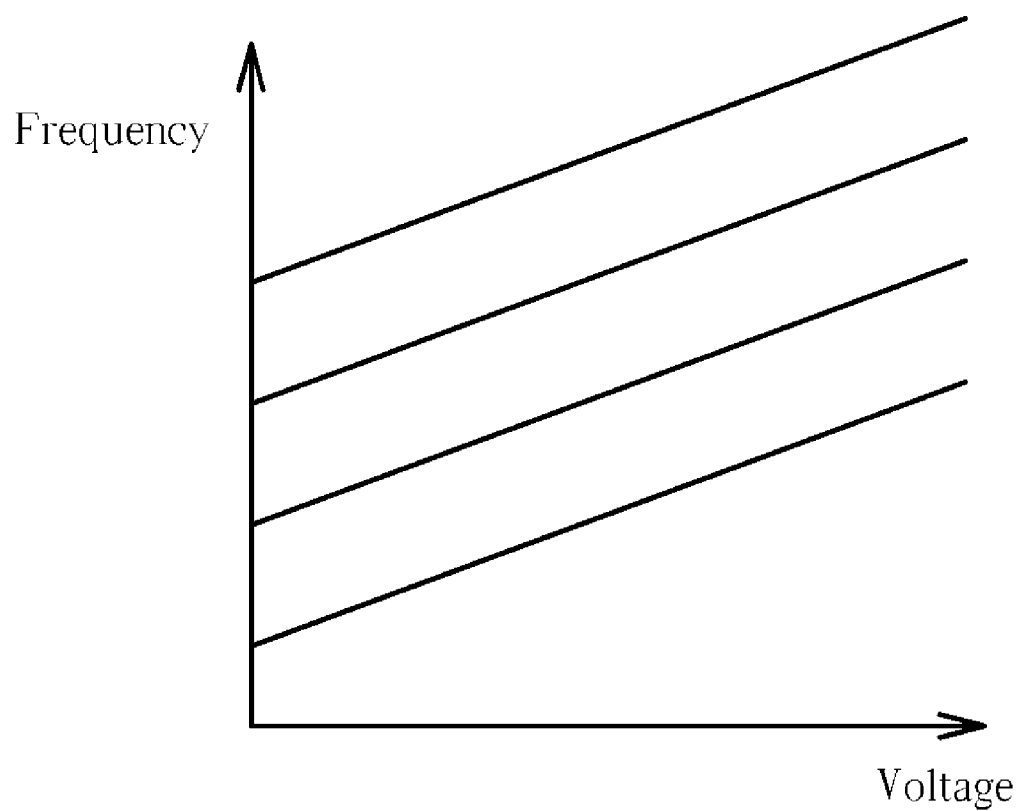
FIG. 2 is a schematic diagram of frequency versus voltage of a VCO having four frequency-operating curves according to FIG. 1.
Figure 3:
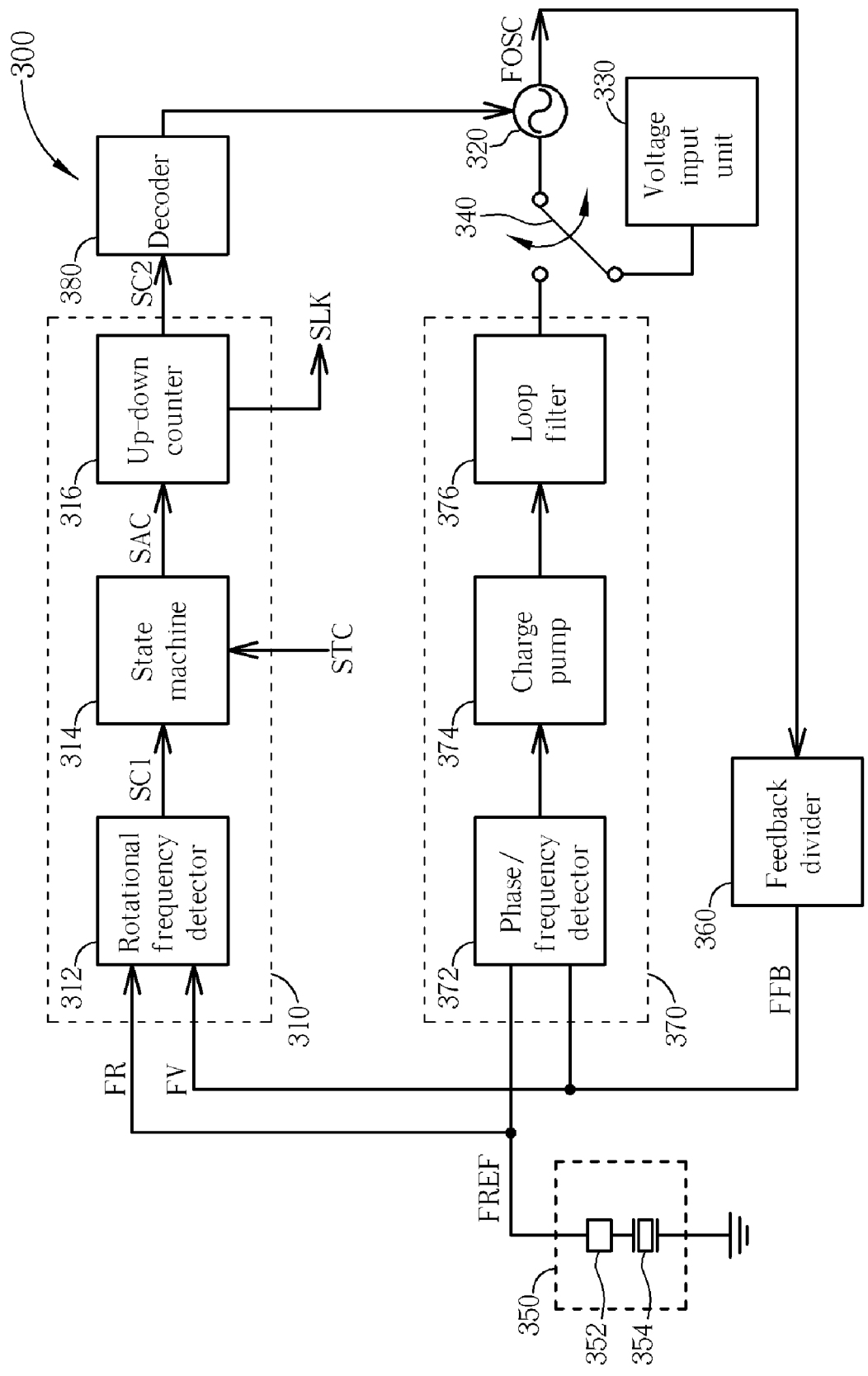
FIG. 3 is a schematic diagram of a loop system according to an embodiment of the present invention.

Please refer to FIG. 3, which is a schematic diagram of a loop system 300 capable of auto-calibrating an oscillating frequency range according to an embodiment of the present invention. The loop system 300 includes a frequency error detector 310, a voltage controlled oscillator (VCO) 320, a voltage input unit 330, a switch 340, a reference frequency generator 350, a feedback divider 360, and a fine frequency-tuner 370. The frequency error detector 310 includes a rotational frequency detector 312, a state machine 314, and an up-down counter 316. The fine frequency-tuner 370 includes a phase/frequency detector 372, a charge pump 374, and a loop filter 376. The fine frequency-tuner 370 is identical to part of the PLL 100 in the prior art, and the operation thereof has been described above, so no further description is given. The difference between the fine frequency-tuner 370 and the PLL 100 is that the charge pump 374 decouples from the loop filter 376 during auto-calibration of the oscillating frequency range in the loop system 300.

The loop system 300 uses a linear-search algorithm to find a frequency-operating curve for the VCO 320. When the loop system 300 powers on, the reference frequency generator 350 generates a reference signal FREF. In general, the reference frequency generator 350 includes a reference frequency divider 352 and a crystal oscillator 354. The crystal oscillator 354 generates a clock signal, and thereby the reference frequency divider 352 divides the frequency of the clock signal to produce the reference signal FREF. As the reference signal FREF becomes stable, having a steady reference frequency FR, the switch 340 couples a terminal of the VCO 320 to the voltage input unit 330. Thus, the VCO 320 decouples from the fine frequency tuner 370. Preferably, the loop system 300 predefines the VCO 320 to operate at a lowest frequency-operating curve while powering on, and then the VCO 320 outputs an oscillating signal FOSC to the feedback divider 360. The feedback divider 360 divides the frequency of the oscillating signal FOSC to produce a feedback signal FFB having a feedback frequency FV. As shown in FIG. 3, the reference signal FREF and the feedback signal FFB are simultaneously inputted to the frequency error detector 310 and the fine frequency tuner 370, respectively. But, the fine frequency tuner 370 does not participate in the whole process of auto-calibration of the loop system 300 due to the decoupling between the VCO 320 and the fine frequency tuner 370. In addition, the fine frequency tuner 370 stops its functions during the decoupling period so that the embodiment of the present invention can save extra electricity used by the fine frequency tuner 370. Each time the VCO 320 changes operation to a new frequency-operating curve, the loop system 300 synchronizes the reference signal FREF and the feedback signal FFB with a synchronization signal, aligning the rising edges of the first clocks of the reference signal FREF and the feedback signal FFB. The synchronizing operation is well known in the art and detailed explanation thereof is omitted.

At the beginning of auto-calibration, the voltage input unit 330 provides a fixed input voltage for the VCO 320, preferably half of the supply voltage of the loop system 300. The oscillating signal FOSC is generated by the VCO 320, and then the frequency thereof is divided by the feedback divider 360, so as to produce the feedback signal FFB having the feedback frequency FV. The rotational frequency detector 312 compares the reference frequency FR and the feedback frequency FV to generate a first control signal SC1. If the reference frequency FR is greater than the feedback frequency FV, which indicates that the oscillating signal FOSC is running slower than the reference signal FREF, the first control signal SC1 is generated with positive polarity. On the contrary, if the reference frequency FR is smaller than the feedback frequency FV, which indicates that the oscillating signal FOSC is running faster than the reference signal FREF, the first control signal SC1 is generated with negative polarity. Moreover, since the VCO 320 operates at the lowest predefined frequency-operating curve, the first control signal SC1 should correspondingly be set with positive polarity. The state machine 314 is coupled to the rotational frequency detector 312, and used for determining an auto-calibration state SAC in accordance with a polarity of the first control signal SC1 and a time-counting signal STC.

The time-counting signal STC is preferably implemented by a counter and is used for limiting the resolution of the frequency error detector 310 when the reference frequency FR and the feedback frequency FV are too close together. The time-counting signal STC provides a coarse-tuning time for resolving the frequency difference (for determining which frequency was higher). Preferably, the coarse-tuning time is inversely proportional to the frequency difference between the reference frequency FR and the feedback frequency FV. If the reference frequency FR and the feedback frequency FV end up being very close together, the time required to resolve the frequency difference might take too much time, being more than the coarse-tuning time. Thus, the coarse-tuning time can prevent the loop system 300 from endless coarse calibration. The detailed operation of the time-counting signal STC will be described in detail later. The up-down counter 316 is coupled to the state machine 314 and used for generating a second control signal SC2 or a coarse-lock-state signal SLK in accordance with the auto-calibration state SAC. The second control signal SC2 is exemplary of a bit-combination signal having multiple bit combinations, each corresponding to a frequency-operating curve. For example, assume that the VCO can operate at eight different frequency-operating curves. The bit combinations therefore can be made up of three bits to represent the frequency-operating curves, such as 000, 001, 011 ... 111. The second control signal SC2 is set to point at the lowest predefined frequency-operating curve in the embodiment of the present invention. Further, the embodiment of the present invention includes a decoder (thermometer decoder) 380 coupled to the up-down counter 316. The decoder 380 is used for decoding the second control signal SC2 and then inputting the second control signal SC2 to the VCO 320. On the other hand, if the up-down counter 316 generates the coarse-lock-state signal SLK, the loop system 300 records the current frequency-operating curve used by the VCO 320, and then the switch 340 switches the VCO 320 to the fine frequency tuner 370. The charge pump 374 and the loop filter 376 then are re-coupled. Finally, the VCO 320 is reset to operate at the frequency-operating curve recorded by the loop system 300. Thus, the fine frequency tuner 370 can perform the fine frequency tuning for the VCO 320 to obtain a resulting frequency more precisely. For the sake of brevity, before the coarse-lock-state signal SLK is generated, this period is seen as an auto-calibration period of the loop system 300. When the coarse-lock-state signal SLK is generated, auto-calibration of the loop system 300 is accomplished.

In order to process auto-calibration successfully, the auto-calibration state SAC has three possible states. The first state SAC1 indicates occurrence of an event whereby the polarity of the first control signal SC1 changes, such as a change from positive polarity to negative polarity. As the first state SAC1 appears in the auto-calibration state SAC, the up-down counter 316 generates the coarse-lock-state signal SLK for the loop system 300. The second state SAC2 indicates occurrence of an event whereby calibration of a certain frequency-operating curve in the VCO 320 is still ongoing when the coarse-tuning time has expired (detailed operation will be described hereinafter). As the second state SAC2 appears in the auto-calibration state SAC, the up-down counter 316 generates the coarse-lock-state signal SLK as well. The third state SAC3 indicates occurrence of an event whereby the calibration (coarse-tuning) of a certain frequency-operating curve is accomplished in the VCO 320 and the polarity of the first control signal SC1 is not changed during the coarse-tuning time. The calibration of the certain frequency-operating curve is a process of increasing frequency of the oscillating signal FOSC step-by-step, and thereby comparing the corresponding reference frequency FR and feedback frequency FV. As the third state SAC3 appears in the auto-calibration state SAC, the up-down counter 316 shifts up the bit combination of the second control signal SC2, such as from '000' up to '001'. The VCO 320 then selects a neighboring frequency-operating curve covering a higher frequency range in accordance with the shifted-up second control signal SC2. Subsequently, the loop system 300 resets the voltage input unit 330 and the time-counting signal STC, and furthermore re-synchronizes the reference signal FREF and the feedback signal FFB. After reset, the time-counting signal STC restarts the countdown with the coarse-tuning time. The calibration of another frequency-operating curve begins, and the loop system 300 repeats the process until the feedback frequency FV is greater than the reference frequency FR, and the corresponding frequency-operating curve of the VCO 320 is recorded. For the sake of brevity, with the auto-calibration state SAC, the loop system 300 can determine whether to terminate the calibration or restart the calibration (coarse-tuning) of the frequency-operating curve for an appropriate frequency range.

Figure 4:
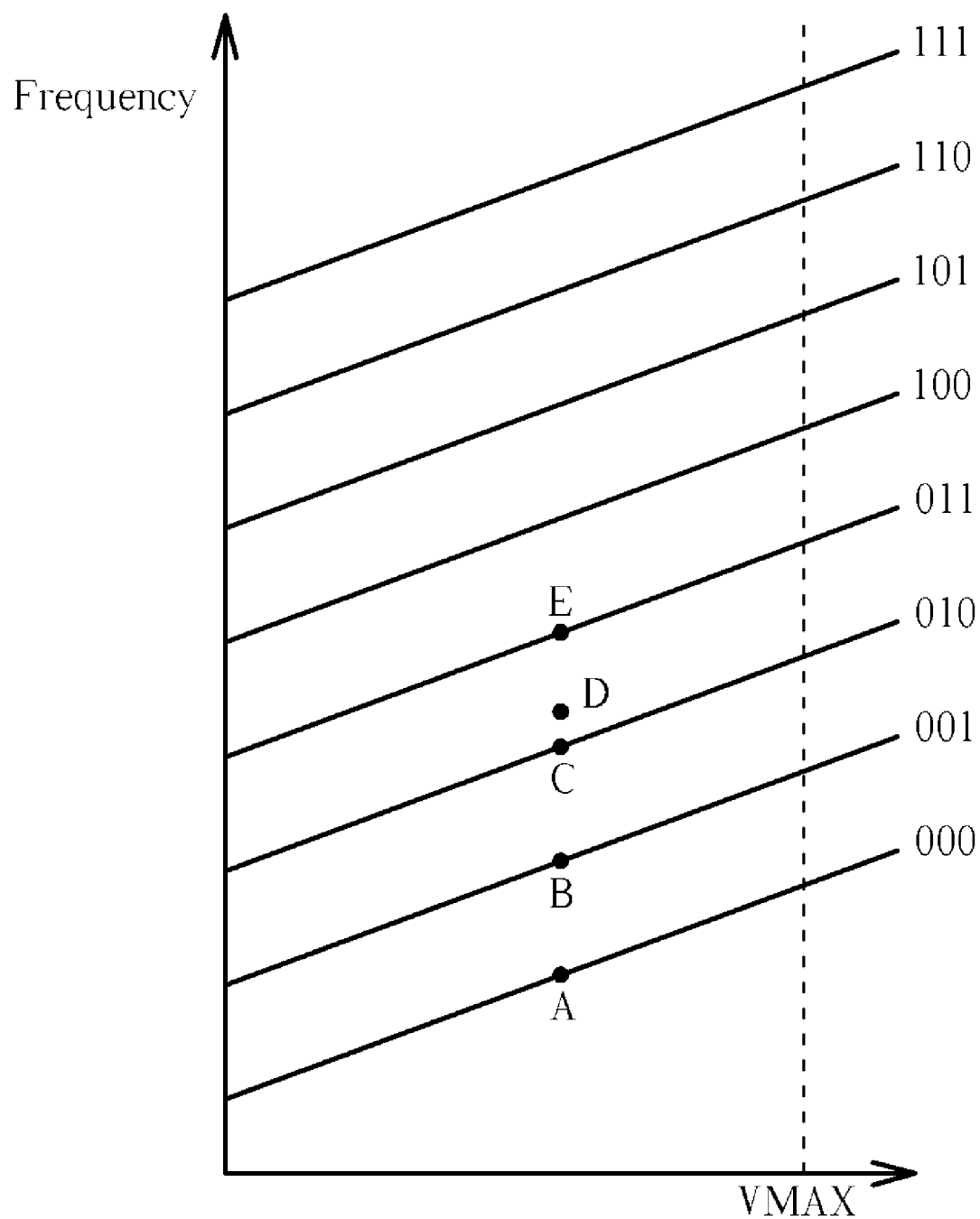
FIG. 4 is a schematic diagram of frequency versus voltage of a VCO having eight frequency-operating curves according to FIG. 3.

In practice, the VCO 320 can utilize multiple varactor (Variable Capacitor) groups to realize the frequency-operating curves. Each varactor of the varactor groups is preferably an n-type accumulation mode MOS device. Each varactor group is selected by through a short circuit or open circuit via a corresponding digital signal, so that the VCO 320 can operate at a selected frequency-operating curve. Please refer to FIG. 4, which takes the VCO 320 having eight frequency-operating curves as an example. In FIG. 4, the X-axis represents working voltage of the VCO 320, and the Y-axis represents frequency of the oscillating signal FOSC. The second control signal SC2 selects the eight frequency-operating curves with different bit combinations, e.g. '000', '001', ... , '111'. Preferably, the frequency-operating curves of the VCO 320 have the following features: (1) each frequency-operating curve spans twice the frequency range of the desired tuning band; (2) adjacent frequency-operating curves overlap by at least the frequency range of the desired tuning band; (3) the frequency range of the desired tuning band lies between the lowest frequency-operating curve and the highest frequency-operating curve. In the embodiment of the present invention, the VCO 320 operates at the lowest curve of the eight frequency-operating curves by default, so that the second control signal SC2 is correspondingly pre-set with '000'. Besides, a target frequency is set to be a point D corresponding to the reference frequency FR. In general, the target frequency does not lie on any of the frequency-operating curves.

The coarse calibration scenario is described as follows. After preparation for the calibration, such as synchronization of the reference signal FREF and the feedback signal FFB, and reset of the time-counting signal, the VCO 320 begins from point A, which locates at the middle of the "000" frequency-operating curve. Accordingly, the feedback frequency FV is set to be the point A at first. The feedback frequency FV is then compared with the point D. Obviously, the feedback frequency FV is much lower than the point D so that the coarse calibration for the "000" frequency-operating curve can be finished before the time-counting signal STC expires. In this situation, the first control signal SC1 does not change polarity due to the comparison result. Thus, the third state SAC3 of the auto-calibration state SAC is generated and thereby the up/down counter 316 increments the second control signal SC2 from '000' to '001'. The VCO 320 starts the next coarse calibration for "001" frequency-operating curve with a point B. The feedback frequency FV is set to be the point B. Same as the point A, the coarse calibration is finished successfully before the time-counting signal STC expires. The VCO 320 moves to the "001" frequency-operating curve and meanwhile, the feedback frequency FV is set to be the point C. When the comparison of the feedback frequency FV and the reference frequency FR starts, two possible events may occur. One is that the frequency comparison cannot be finished successfully when the time-counting signal STC expires because the points C and D are too close. In this situation, the second state SAC2 is generated and thereby the result of the coarse calibration is accomplished by generating the coarse-lock-state signal SLK and recording the second control signal SC2 to "001". The other is that the coarse calibration with respect to the point C is as success as those with respect to the points A and B. The VCO 320 then moves to the "011" frequency-operating curve and the feedback frequency FV is set to be the point E. Since the point E is obviously higher than the point D, the feedback frequency FV appears faster than the reference frequency FR, triggering a change of polarity of the first control signal SC1. The polarity change of the first control signal SC1 further triggers the first state SAC1 of the auto-calibration state SAC. At last, the coarse-lock-state signal SLK is generated, and the second control signal SC2 is recorded with '010', which are the programming bits for the VCO varactor array.

Figure 5:
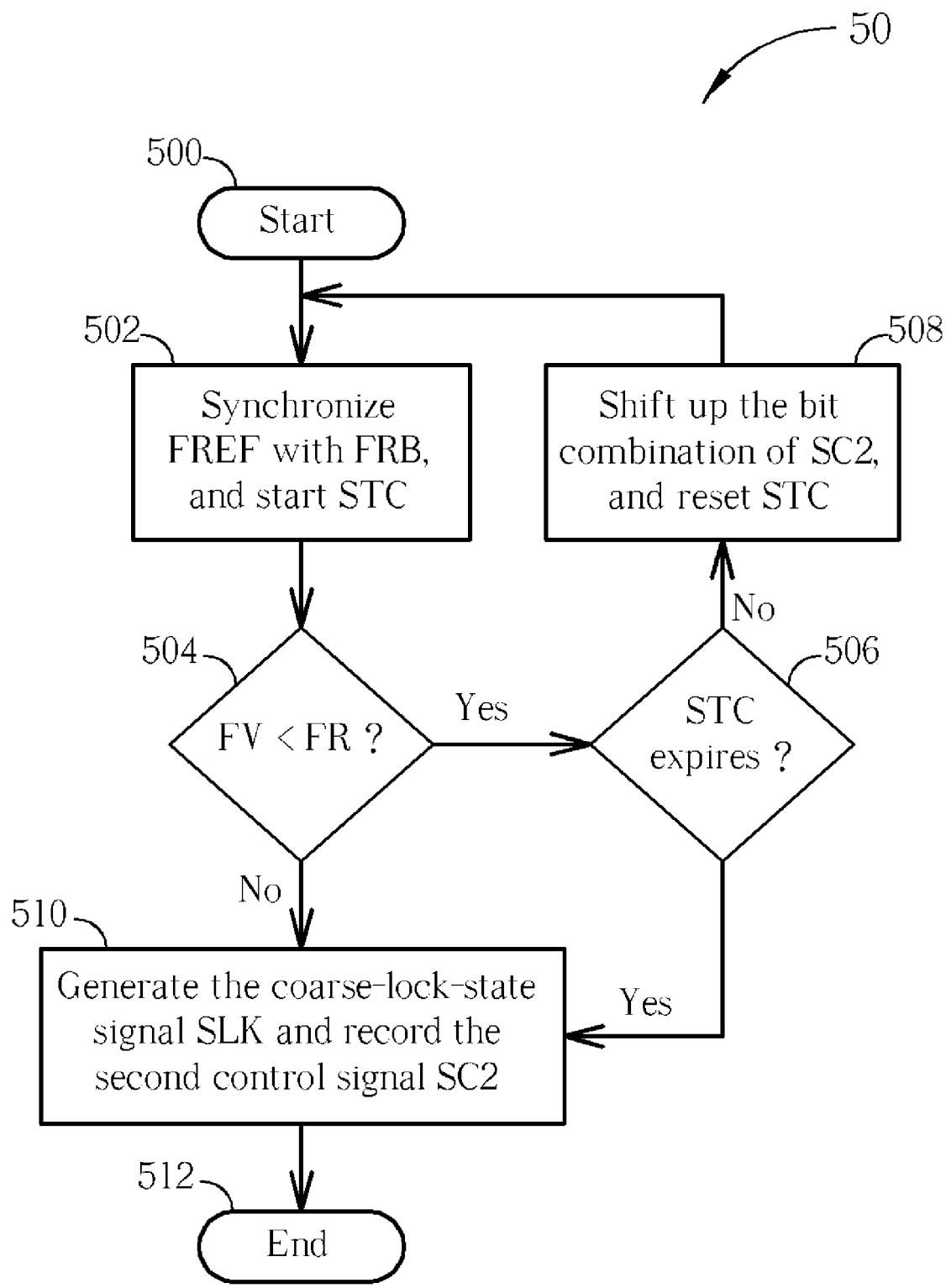
FIG. 5 is a flowchart of a process of auto-calibrating an oscillating frequency range according to FIG. 3.

Please refer to FIG. 5, which is a flowchart of a process 50 used for auto-calibrating an oscillating frequency range according to FIG. 3. The process 50 includes the following steps:

Step 500: Start.

Step 502: Synchronize the reference signal FREF with the feedback signal FRB, and start the operation of the time-counting signal STC.

Step 504: Compare the feedback frequency FV with the reference frequency FR, and determine if the feedback frequency FV is smaller than the reference frequency FR or not. If not, generate the first state SAC1 and then go to Step 510. If so, go to Step 506.

Step 506: Determine if the operation of the time-counting signal STC expires or not. If so, generate the second state SAC2, and then go to Step 510. If not, generate the third state SAC3, and then go to Step 508.

Step 508: Shift up the bit combination of the second control signal SC2, reset the time-counting signal STC, and then go to Step 502.

Step 510: Generate the coarse-lock-state signal SLK, and record the second control signal SC2.

Step 512: End.

In Step 502, the feedback frequency FRB is obtained by dividing the frequency of the oscillating signal FOSC. In Step 502 and Step 506, the operation of the time-counting signal STC is to countdown for the coarse-tuning time. In Step 508 and Step 510, the second control signal SLK and the coarse-lock-state signal SLK have to be decoded in advance. According to the process 50, the embodiment of the present invention determines the state of the auto-calibration state SAC in accordance with a comparison result of the reference frequency and the feedback frequency and the time-counting signal STC. Further, the embodiment of the present invention determines whether the VCO changes the frequency-operating curve or not, so as to achieve the purpose of the auto-calibration.

Please note that those skilled in the art can make modifications to the relationship between the polarities of the first control signal SC1 and the comparison result of the reference frequency FR and the feedback frequency FV on a basis of circuit and program design. Besides, the predetermined frequency-operating curve for the VCO 320 is not limited to the lowest frequency-operating curve, and can be the highest frequency-operating curve. Regarding the coarse-tuning time, the time-counting signal STC may count by increasing or decreasing a number one-by-one, such as 1, 2 . . . , 255, 256 or 256, 255 . . . , 2, 1. The coarse-tuning time can be adjusted based on the speed of the calibration. Moreover, a dividing factor of the feedback divider 360 is not limited to a specific value, and can be modified according to different applications. For example, for a Bluetooth system, the physical layer operates in an ISM band of about 2.4 GHz, where the central frequency thereof is near 2432 MHz. Assume that the reference signal generator 350 generates the reference signal FREF having frequency of 4 MHz. Since 2432M is 608 times 4M, the dividing number of the feedback divider 360 should be set to 608. Thus, when the loop system 300 powers on, the feedback frequency FV gradually increases to about 2432 MHz through the feedback mechanism.

In conclusion, in the prior art, the VCO can only operate in a specific frequency range due to the hard wiring of the VCO. Compared with the prior art, the embodiment of the present invention utilizes a frequency error detector to realize the auto-calibration through a comparison of the reference and feedback frequency and a linear search algorithm. Thus, the embodiment of the present invention can select the most appropriate frequency-operating curve for the VCO and increases flexibility in the oscillating frequency range of the VCO. Therefore, the present invention frequency error detector can achieve auto-calibration over a wide oscillating frequency range for the VCO.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A loop system capable of auto-calibrating an oscillating frequency range comprising:
   a frequency error detector for generating a second control signal or a coarse-lock-state signal and performing coarse tuning in accordance with a reference frequency and a feedback frequency, the frequency error detector comprising:
      a rotational frequency detector for comparing the reference frequency and the feedback frequency so as to generate a first control signal;
      a state machine coupled to the rotational frequency detector for determining an auto-calibration state in accordance with a polarity of the first control signal and a time-counting signal; and
      an up-down counter coupled to the state machine, for generating the second control signal or the coarse-lock-state signal in accordance with the auto-calibration state;
   a voltage controlled oscillator (VCO) coupled to the frequency error detector for selecting to operate at one of a plurality of frequency operating curves in accordance with the second control signal so as to generate an oscillating signal;
   a voltage input unit for providing a fixed voltage to the VCO; and
   a switch for switching the VCO to couple to the voltage input unit or to couple to a fine frequency tuner in accordance with the coarse-lock-state signal.

2. The loop system of claim 1, wherein the fine frequency tuner comprises:
- a phase/frequency detector for generating a third control signal in accordance with the reference frequency and the feedback frequency;
- a charge pump coupled to the phase/frequency detector for generating a control current in accordance with the third control signal; and
- a loop filter coupled to the charge pump and the switch for providing a control voltage to the switch in accordance with the control current.

3. The loop system of claim 1 further comprising a reference frequency generator for generating the reference frequency.

4. The loop system of claim 1, wherein the second control signal corresponds to one of the plurality of frequency operating curves.

5. The loop system of claim 1, wherein the second control signal corresponds to the lowest curve of the plurality of frequency operating curves.

6. The loop system of claim 1, wherein the VCO further comprises a plurality of varactor (Variable Capacitor) groups, each varactor group corresponding to one of the plurality of frequency operating curves.

7. The loop system of claim 6, wherein every varactor of the plurality of varactor groups is an n-type accumulation mode MOS device.

8. The loop system of claim 1 further comprising a feedback divider coupled to the frequency error detector and the VCO for dividing a frequency of the oscillating signal for generating the feedback frequency.

9. The loop system of claim 1, wherein a predetermined working frequency of the VCO corresponds to the lowest curve of the plurality of frequency operating curves.

10. The loop system of claim 1 further comprising a thermometer decoder coupled to the up-down counter for decoding the second control signal and inputting the second control signal to the VCO.

11. A method of auto-calibrating an oscillating frequency range comprising:
- comparing a reference frequency and a feedback frequency so as to generate a first control signal;
- determining an auto-calibration state in accordance with a polarity of the first control signal and a time-counting signal;
- generating a second control signal or a coarse-lock-state signal in accordance with the auto-calibration state; and
- controlling a voltage controlled oscillator (VCO) to operate at one of a plurality of frequency operating curves in accordance with the second control signal so as to generate an oscillating signal.

12. The method of claim 11 further comprising adjusting a working voltage of the VCO or fine-tuning an output frequency of the VCO.

13. The method of claim 12, wherein fine-tuning an output frequency of the VCO comprises:
- generating a third control signal in accordance with the reference frequency and the feedback frequency;
- generating a control current in accordance with the third control signal; and
- generating a control voltage to control the VCO in accordance with the control current.

14. The method of claim 11, wherein the second control signal corresponds to one of the plurality of frequency operating curves.

15. The method of claim 11, wherein the second control signal corresponds to the lowest curve of the plurality of frequency operating curves.

16. The method of claim 11, wherein a predetermined working frequency of the VCO corresponds to the lowest curve of the plurality of frequency operating curves.

17. The method of claim 11 further comprising dividing a frequency of the oscillating signal so as to generate the feedback frequency.

18. The method of claim 11 further comprising decoding the second control signal and inputting the second control signal to the VCO.

* * * * *